US012804966B2

(12) United States Patent
Nishi et al.

(10) Patent No.: US 12,804,966 B2
(45) Date of Patent: Nov. 17, 2026

(54) SEMICONDUCTOR DEVICE

(71) Applicant: Mitsubishi Electric Corporation, Tokyo (JP)

(72) Inventors: Koichi Nishi, Tokyo (JP); Tetsuya Nitta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 474 days.

(21) Appl. No.: 18/453,932

(22) Filed: Aug. 22, 2023

(65) Prior Publication Data

US 2024/0153989 A1 May 9, 2024

(30) Foreign Application Priority Data

Nov. 9, 2022 (JP) ................................ 2022-179333

(51) Int. Cl.
*H10D 62/10* (2025.01)
*H10D 64/00* (2025.01)

(52) U.S. Cl.
CPC ......... *H10D 62/112* (2025.01); *H10D 62/109* (2025.01); *H10D 64/111* (2025.01)

(58) Field of Classification Search
CPC .... H10D 62/112; H10D 62/10; H10D 62/105; H10D 62/106; H10D 62/111;
(Continued)

(56) References Cited

U.S. PATENT DOCUMENTS 5,086,332 A 2/1992 Nakagawa et al.
2010/0044825 A1* 2/2010 Schmidt ............... H10D 12/032 257/493

(Continued)

FOREIGN PATENT DOCUMENTS

DE 10 2012 219 644 A1 6/2013
JP H01-138759 A 5/1989

(Continued)

OTHER PUBLICATIONS

An Office Action; "Notice of Reasons for Refusal," mailed by the Japanese Patent Office on Sep. 9, 2025, which corresponds to Japanese Patent Application No. 2022-179333 and is related to U.S. Appl. No. 18/453,932; with English language translation.

(Continued)

*Primary Examiner* — Syed I Gheyas
(74) *Attorney, Agent, or Firm* — Studebaker Brackett PLLC

(57) ABSTRACT

On a semiconductor substrate comprising a semiconductor device, a drift layer of a first conductivity type is formed, and a well layer of a second conductivity type in which an impurity concentration decreases toward the outside of the semiconductor substrate and a channel stopper layer of the first conductivity type are formed in the surface portion of the semiconductor substrate in the termination region. The termination region includes an alleviating region having the well layer formed therein, a RESURF region positioned outside the alleviating region and having the well layer formed shallowly, and a channel stopper region having the channel stopper layer formed therein. A gate wiring electrode is formed on the alleviating region and a channel stopper electrode is formed on the channel stopper region. The gate wiring electrode and the channel stopper electrode are covered with a semi-insulating film electrically connecting therebetween.

9 Claims, 7 Drawing Sheets

(58) Field of Classification Search
CPC .... H10D 62/124; H10D 62/127; H10D 62/60; H10D 62/109
See application file for complete search history.

(56) References Cited

U.S. PATENT DOCUMENTS

| | | | | |
|---|---|---|---|---|
| 2010/0252904 | A1 | 10/2010 | Takahashi et al. | |
| 2011/0233714 | A1* | 9/2011 | Lu | H10D 12/481<br>257/493 |
| 2013/0161645 | A1* | 6/2013 | Takahashi | H10D 12/441<br>257/493 |
| 2020/0127082 | A1 | 4/2020 | Chen et al. | |

FOREIGN PATENT DOCUMENTS

| | | | | |
|---|---|---|---|---|
| JP | 2010-245281 | A | 10/2010 | |
| JP | 2020-068244 | A | 4/2020 | |
| WO | WO-2015104900 | A1 * | 7/2015 | H10D 8/411 |

OTHER PUBLICATIONS

Office Action issued in DE 10 2023 125 588.6; mailed by the German Patent and Trademark Office on Mar. 31, 2026.

* cited by examiner

SEMICONDUCTOR DEVICE

BACKGROUND OF THE INVENTION

Field of the Invention

The present disclosure relates to a semiconductor device.

Description of the Background Art

As a terminal structure of a vertical semiconductor device, a Variation of Lateral Doping (VLD) structure is known in which the impurity concentration in the electric field alleviating layer is decreased toward the outside of a semiconductor substrate (for example, International Publication No. 2015/104900 below).

In International Publication No. 2015/104900, it is proposed to provide field plate electrodes on the VLD structure, where the ratio (W/D) between the width (W) and the spacing (D) of the field plate electrode is reduced toward the outside of the semiconductor substrate. This structure can improve the breakdown voltage of the semiconductor device by making the potential distribution of the field plate electrodes similar to the potential distribution of the electric field alleviating layer. However, with this structure, the widths of the field plate electrodes are narrowed at the peripheral portion of the semiconductor substrate; therefore, the field plate electrodes tend to slide due to stress, leading to a decrease in reliability.

SUMMARY

An object of the present disclosure is to improve the breakdown voltage of the semiconductor device while keeping a width of an electrode arranged on an electric field alleviating layer of the VLD structure wide.

A semiconductor device according to the present disclosure includes a semiconductor substrate having a drift layer of a first conductivity type formed therein, an active region in which a semiconductor element is formed in the conductor substrate, a termination region, which is a region outside the active region in the semiconductor substrate, a well layer of a second conductivity type formed in the surface portion of the semiconductor substrate in the termination region, in which an impurity concentration of the second conductivity type decreases toward the outside of the semiconductor substrate, and a channel stopper layer of the first conductivity type formed in the surface portion of the semiconductor substrate, being more outside than the well layer is. The termination region includes an alleviating region adjacent to the active region and having the well layer formed therein, a RESURF region positioned outside the alleviating region and having the well layer formed more shallowly than that in the alleviating region, a channel stopper region positioned outside the RESURF region and having the channel stopper layer formed therein, an electrode formed on the alleviating region through an interlayer insulating film, a channel stopper electrode connected to the channel stopper layer, and a semi-insulating film covering the electrode and the channel stopper electrode and electrically connecting the electrode and the channel stopper electrode.

According to the present disclosure, the wiring electrode and the channel stopper electrode are electrically connected by the semi-insulating film, and this brings the potential distribution between the wiring electrode and the channel stopper electrode close to the potential distribution of the well layer, improving the breakdown voltage of the semiconductor device. Further, a narrow electrode is not required to be provided on the well layer; therefore, the electrode is suppressed from being slid due to stress, which contributes to the improvement of reliability.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
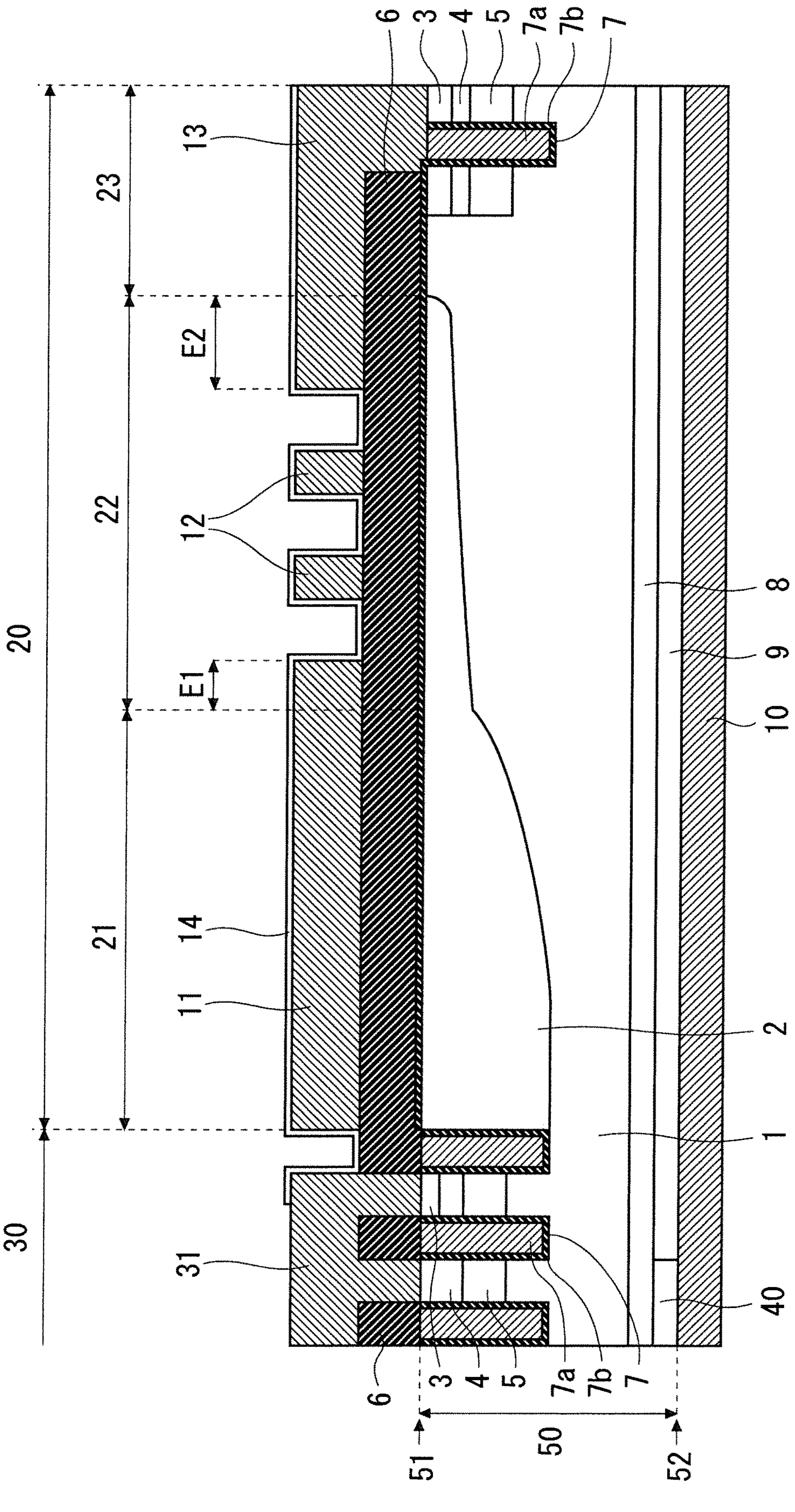
FIG. 1 is a cross-sectional view of a semiconductor device according to Embodiment 1.

FIG. 1 is a cross-sectional view of a semiconductor device according to Embodiment 1. In Embodiments, although the semiconductor device represents a Reverse Conducting IGBT (RC-IGBT) in which an Insulated Gate Bipolar Transistor (IGBT) and a Free Wheeling Diode (FWD) are integrated into one chip, the semiconductor device may represent a Metal Oxide Semiconductor Field Effect Transistor (MOSFET) or a Schottky Barrier Diode (SBD) may be adoptable. Further, in the following description, although the N-type represents the first conductivity type and the P-type represents the second conductivity type, the P-type may represent the first conductivity type and the N-type may represent the second conductivity type in a reversed manner.

As illustrated in FIG. 1, the semiconductor device according to Embodiment 1 is formed using a semiconductor substrate 50. Here, the upper main surface of the semiconductor substrate 50 in FIG. 1 is defined as a first main surface 51, and the lower main surface of the semiconductor substrate 50 is defined as a second main surface 52.

The material of the semiconductor substrate 50 may be, in addition to silicon (Si), a wide band gap semiconductor such as silicon carbide (SiC), gallium nitride (GaN), or diamond may be adoptable. When a wide bandgap semiconductor is used as a material of the semiconductor substrate 50, a semiconductor device excellent in operation at a higher voltage, a larger current, and a higher temperature can be obtained as compared with a semiconductor device using silicon. Further, any of an FZ substrate formed by the Floating Zone (FZ) method, a substrate formed by the Magneticfield applied Czochralski (MCZ) method, and any epitaxial substrate formed by the epitaxial growth method may be adoptable to the semiconductor substrate 50.

A first conductivity type drift layer 1 is formed between the first main surface 51 and the second main surface 52 of the semiconductor substrate 50. Also, the semiconductor substrate 50 is defined with an active region 30 in which an RC-IGBT as a semiconductor element is formed, and a termination region 20 surrounding the active region 30.

First, the configuration of an active region 30 will be described.

In the active region 30, a base layer 4 of the second conductivity type is formed in the surface portion of the semiconductor substrate 50 on the first main surface 51 side, and the emitter layer 3 is selectively formed in the surface portion of the base layer 4. Further, in present Embodiment, a first conductivity type carrier accumulation layer 5 having a higher impurity peak concentration than that of the drift layer 1 is formed between the base layer 4 and the drift layer 1.

A trench 7 adjacent to the emitter layer 3 and extending through the base layer 4 and the carrier accumulation layer 5 to reach the drift layer 1 is formed on the first main surface 51 of the semiconductor substrate 50. A gate insulating film **7*b* is formed on the side and bottom surfaces of the trench 7. A gate electrode 7*a* is formed on the gate insulating film 7*b* so as to be embedded in the trench 7**.

An interlayer insulating film 6 is formed on the first main surface 51 of the semiconductor substrate 50 so as to cover the gate electrode **7*a*. An emitter electrode 31 is formed on the interlayer insulating film 6. The emitter electrode 31 is electrically connected to the emitter layer 3 and the base layer 4 through a contact hole formed in the interlayer insulating film 6**.

A second conductivity type collector layer 9 and a first conductivity type cathode layer 40 are selectively formed in the surface portion of the semiconductor substrate 50 on the second main surface 52 side. Further, in present Embodiment, a first conductivity type buffer layer 8 having a higher impurity peak concentration than that of the drift layer 1 is formed between the collector layer 9 and the cathode layer 40 and the drift layer 1. A collector electrode 10 electrically connected to the collector layer 9 and the cathode layer 40 is formed on the second main surface 52 of the semiconductor substrate 50.

Next, the configuration of the termination region 20 will be described.

As illustrated in FIG. 1, the drift layer 1, the buffer layer 8, the collector layer 9, the collector electrode 10 and interlayer insulating film 6 described above are formed not only in the active region 30 but also in the termination region 20.

In the termination region 20, a second conductivity type well layer 2 is formed as an electric field alleviating layer in the surface portion of the semiconductor substrate 50 on the first main surface 51 side. The termination region 20 is divided into an alleviating region 21 adjacent to the active region 30 and in which the well layer 2 is formed relatively deeply, the RESURF region 22 positioned outside the alleviating region 21 with the well layer 2 formed shallower than that in the alleviating region 21, and a channel stopper region 23 positioned outside the RESURF region 22 in order from the inside of the semiconductor substrate 50. In present Embodiment, the peak position of the impurity concentration of the second conductivity type in the well layer 2 of the alleviating region 21 is set at a deeper position than the peak position of the impurity concentration of the second conductivity type in the well layer 2 of the RESURF region 22 (that is, the position far from the main surface 51), thereby making the well layer 2 of the alleviating region 21 deeper than the well layer 2 of the RESURF region 22. However, the depth of the well layer 2 is also adjustable by the impurity concentration; therefore, for example, lowering the impurity concentration of the second conductivity type in the well layer 2 of the RESURF region 22 than the impurity concentration of the second conductivity type in the well layer 2 of the relaxation region 21 makes the well layer 2 of the RESURF region 22 shallower than the well layer 2 of the alleviating region 21. Therefore, the peak position of the impurity concentration of the second conductivity type in the well layer 2 of the alleviating region 21 and the peak position of the impurity concentration of the second conductivity type in the well layer 2 of the RESURF region 22 may be at the same depth.

The well layer 2 is an impurity region having a so-called VLD structure in which the impurity concentration of the second conductivity type decreases toward the outside of the semiconductor substrate 50. That is, in the alleviating region 21, the impurity concentration of the second conductivity type of the well layer 2 decreases from the outer periphery of the active region 30 toward the outer periphery of the alleviating region 21. Also, in the RESURF region 22, the impurity concentration of the second conductivity type of the well layer 2 decreases from the outer periphery of the alleviating region 21 toward the outer periphery of the RESURF region 22.

In the channel stopper region 23, as with the active region 30, the first conductivity type emitter layer 3 is formed in the surface portion on the first main surface 51 side of the semiconductor substrate 50, and the emitter layer 3 serves as the channel stopper layer. In present Embodiment, the base layer 4, the carrier accumulation layer 5, the trench 7, the gate electrode **7*a*, and the gate insulating film 7*b* are also provided in the channel stopper region 23 as illustrated in FIG. 1**. However, these may be omitted.

A gate wiring electrode 11, a field plate electrode 12, and a channel stopper electrode 13 are formed on the interlayer insulating film 6 in the termination region 20. The gate wiring electrode 11 connected to the gate electrode **7*a* in a not illustrated region, is formed in the alleviating region 21, and an outer end thereof projects into the RESURF region 22. One or more (two in FIG. 1) field plate electrodes 12 are formed in the RESURF region 22. The channel stopper electrode 13 is formed in the channel stopper region 23 and an inner end thereof projects into the RESURF region 22. Also, the channel stopper electrode 13 is electrically connected to, through a contact hole formed in the interlayer insulating film 6, the emitter layer 3 of the channel stopper region 23** being a channel stopper layer.

The gate wiring electrode 11, the field plate electrodes 12, and the channel stopper electrode 13 are covered with a semi-insulating film 14. Therefore, the gate wiring electrode 11, the field plate electrodes 12, and the channel stopper electrode 13 are separated from each other, yet are electrically connected through the semi-insulating film 14. This configuration enables to bring the potential distribution of the field plate electrodes 12 close to the potential distribution of the well layer 2 being an electric field alleviating layer, while keeping the width of the field plate electrodes 12 wide, so that the breakdown voltage of the semiconductor device can be improved. Further, by keeping the width of the field plate electrodes 12 wide, the field plate electrodes 12 are prevented from being slid due to the stress from the sealing material (for example, resin) that seals the chip of the semiconductor device, improving the reliability of the semiconductor device. The aspect ratio (height/width) of the field plate electrode 12 is desirably 1 or less.

Furthermore, the above configuration allows the field plate electrodes 12 to be a single-layered, and reduction in the manufacturing cost for forming the termination structure. The gate wiring electrode 11, the field plate electrodes 12 and the channel stopper electrode 13 can be made of a same conductive material used for the emitter electrode 31, thereby making a contribution to the reduction in the manufacturing cost.

The even intervals for the gate wiring electrode 11, the field plate electrodes 12, and the channel stopper electrodes 13 are preferable. With such a configuration, the breakdown voltage of the semiconductor device is stabilized. Further, when a plurality of field plate electrodes 12 are provided, it is preferable that the plurality of field plate electrodes 12 have an even width. With such a configuration, the field plate electrodes 12 are prevented from being slid.

Embodiment 2

Figure 2:
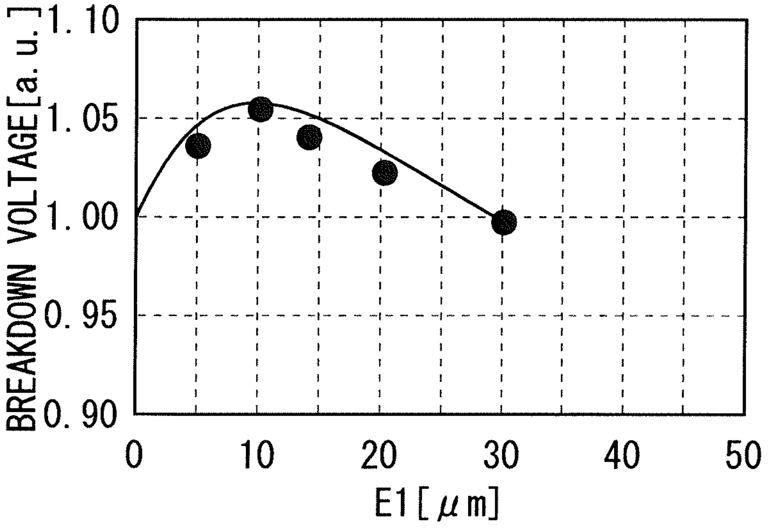
FIG. 2 is a graph illustrating the relationship between a length (E1) of gate wiring overhanging into a RESURF region and the breakdown voltage of the semiconductor device.

FIG. 2 illustrates the relationship between the length (E1) by which the gate wiring electrode 11 projects into the RESURF region 22, that is, the length indicating from the boundary between the alleviating region 21 and the RESURF region 22 to the outer end of the gate wiring electrode 11 and the breakdown voltage of the semiconductor device, in the semiconductor device according to Embodiment 1 (FIG. 1). Note that when the outer end of the gate wiring electrode 11 is positioned inside the boundary between the alleviating region 21 and the RESURF region 22, E1 takes a negative value.

As illustrated in FIG. 2, the breakdown voltage of the semiconductor device has a maximum value with respect to E1. This is because, smaller E1 causes the electric field to concentrate on the boundary between the alleviating region 21 and the RESURF region 22, resulting in a decrease in breakdown voltage, whereas larger E1 reduces the number of field plate electrodes 12 to be arranged on the RESURF region 22 resulting in a decrease in breakdown voltage. Therefore, in Embodiment 2, the breakdown voltage of the semiconductor device improves by setting E1 to 0 μm or more and 30 μm or less.

Embodiment 3

Figure 3:
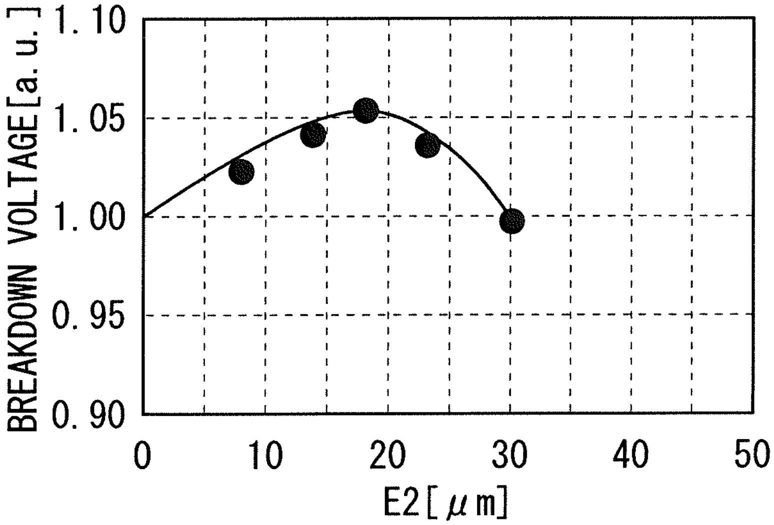
FIG. 3 is a graph illustrating the relationship between a length (E2) of a channel stopper electrode projecting into the RESURF region and the breakdown voltage of the semiconductor device.

FIG. 3 illustrates the relationship between the length (E2) by which the channel stopper electrode 13 projects into the RESURF region 22, that is, the length indicating from the boundary between the RESURF region 22 and the channel stopper region 23 to the outer end of the channel stopper electrode 13 and the breakdown voltage of the semiconductor device, in the semiconductor device according to Embodiment 1 (FIG. 1). Note that when the inner end of the channel stopper electrode 13 is positioned outside the boundary between the RESURF region 22 and the channel stopper region 23, E2 takes a negative value.

As illustrated in FIG. 3, the breakdown voltage of the semiconductor device has a maximum value with respect to E2. This is because, smaller E2 causes the electric field to concentrate on the boundary between the RESURF region 22 and the channel stopper region 23, resulting in a decrease in breakdown voltage, whereas larger E2 reduces the number of field plate electrodes 12 to be arranged on the RESURF region 22 resulting in a decrease in breakdown voltage. Therefore, in Embodiment 2, the breakdown voltage of the semiconductor device improves by setting E2 to 0 μm or more and 30 μm or less.

Embodiment 4

Figure 4:
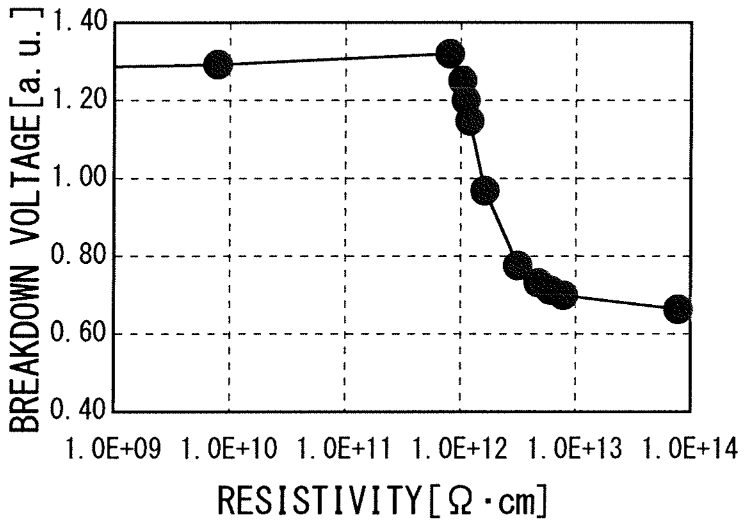
FIG. 4 is a graph illustrating the relationship between the resistivity of a semi-insulating film and the breakdown voltage of the semiconductor device.

FIG. 4 illustrates the relationship between the resistivity of the semi-insulating film 14 and the breakdown voltage of the semiconductor device, in the semiconductor device according to Embodiment 1 (FIG. 1).

As illustrated in FIG. 4, when the resistivity of the semi-insulating film 14 exceeds a certain value, the breakdown voltage of the semiconductor device lowers. This is because, higher resistivity of the semi-insulating film 14 causes instability of the potential distribution between the gate wiring electrode 11 and the field plate electrode 12, between the field plate electrodes 12, and between the field plate electrode 12 and the channel stopper electrode 13 resulting in a decrease in breakdown voltage. Therefore, in Embodiment 4, the breakdown voltage of the semiconductor device improves by setting the resistivity of the semi-insulating film 14 to $1\times10^{12}$ Ω·cm or less.

Embodiment 5

Figure 5:
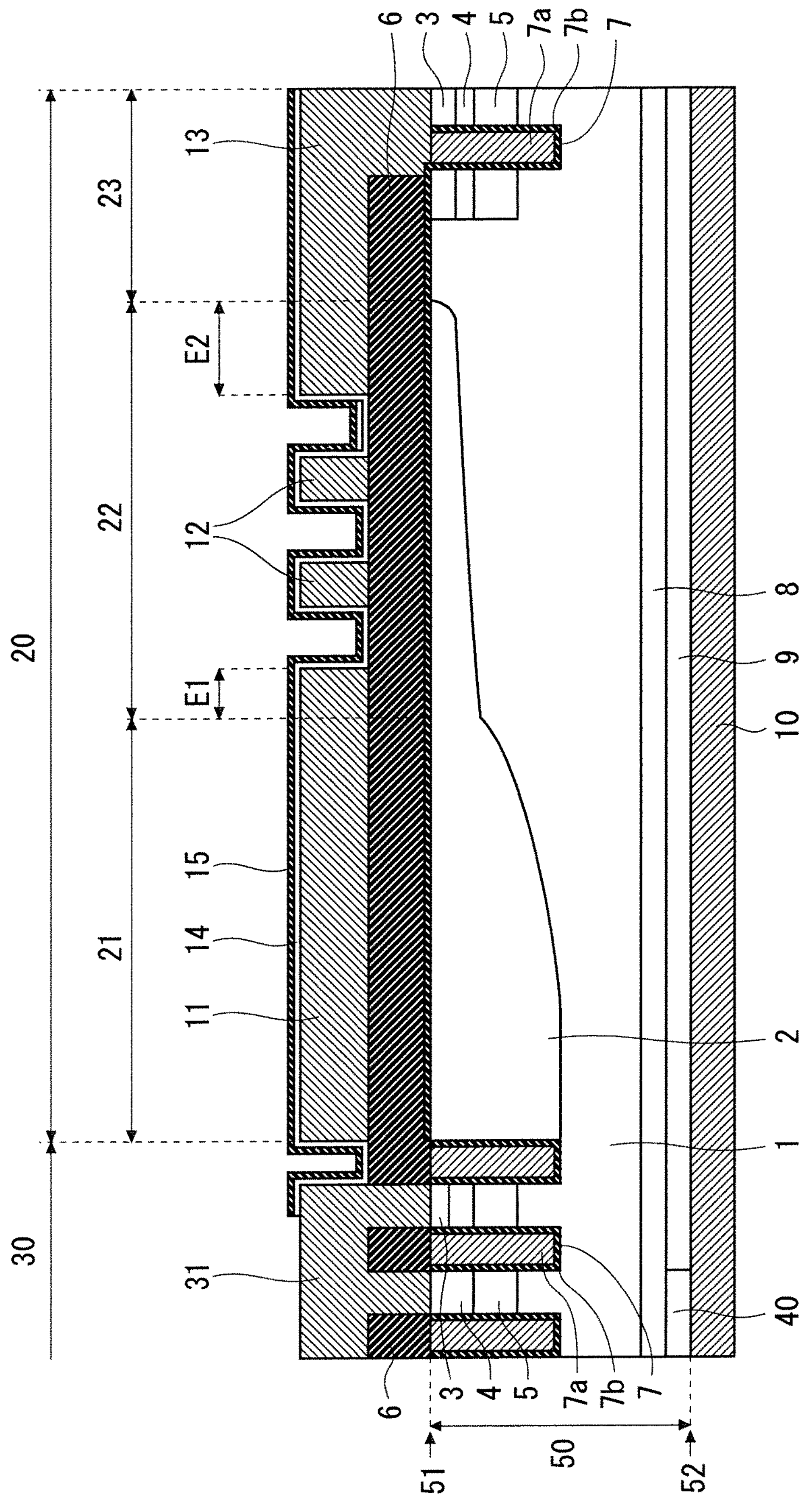
FIG. 5 is a cross-sectional view of a semiconductor device according to Embodiment 5.

FIG. 5 is a cross-sectional view of a semiconductor device according to Embodiment 5. The configuration of FIG. 5 is obtained by providing an insulating film 15 on the semi-insulating film 14 in contrast to the configuration of FIG. 1. The insulating film 15 protects the semi-insulating film 14 from the manufacturing process after the forming step of the semi-insulating film 14 onward and from the sealing material that seals the chips of the semiconductor device, thereby improving the reliability of the semiconductor device.

Embodiment 6

Figure 6:
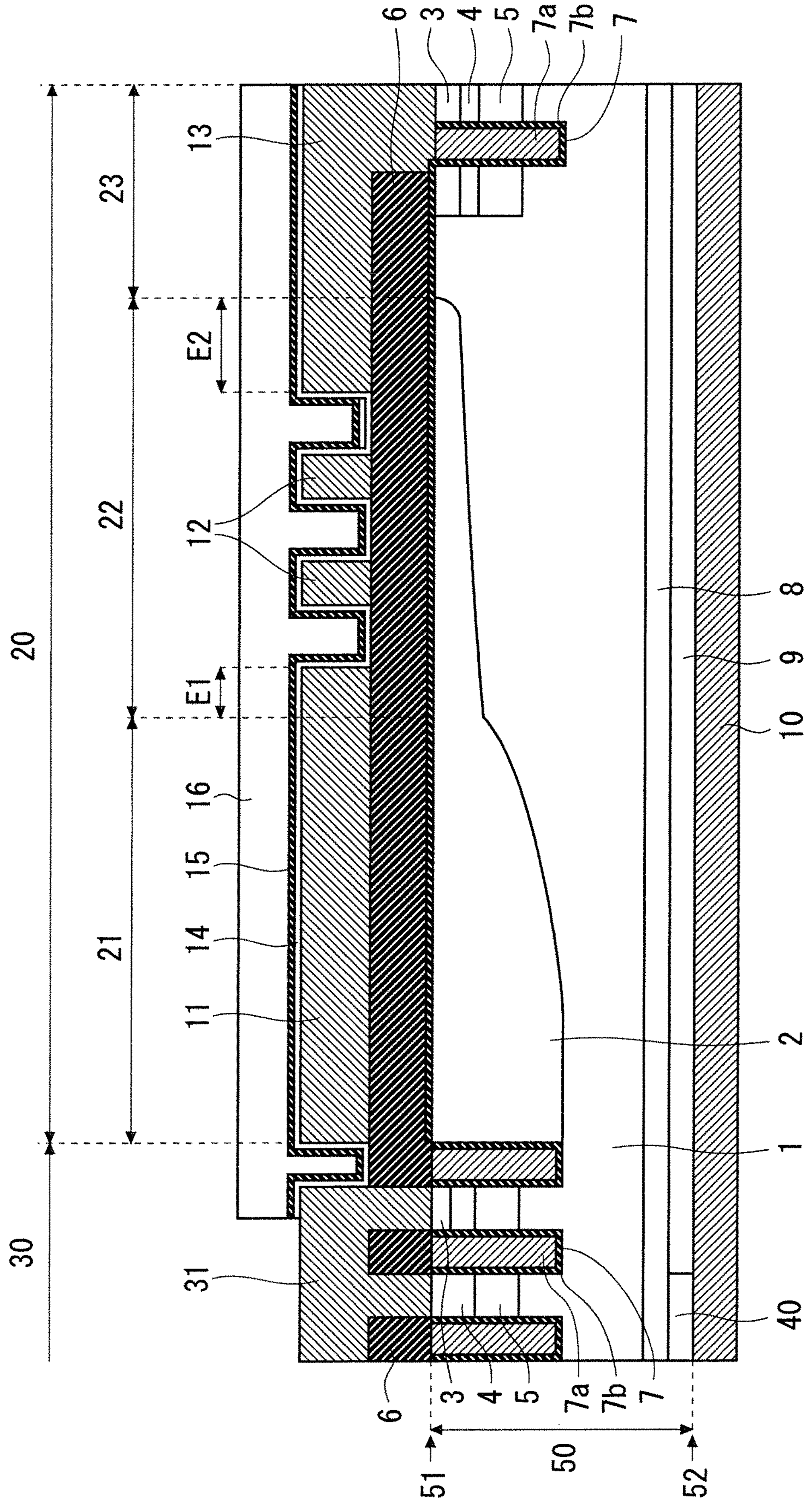
FIG. 6 is a cross-sectional view of a semiconductor device according to Embodiment 6.

FIG. 6 is a cross-sectional view of a semiconductor device according to Embodiment 6. The configuration of FIG. 6 is obtained by providing a surface protective film 16 on the insulating film 15 in contrast to the configuration of FIG. 5. Note that the surface protective film 16 may be provided in the configuration of FIG. 1. In other words, the surface protective film 16 may be provided on the semi-insulating film 14.

In the semiconductor device according to Embodiment 6, the surface protective film 16 fills concave and convex portions present on the upper surface of semi-insulating film 14 according to the shapes of the gate wiring electrode 11, the field plate electrodes 12, and channel stopper electrode 13. Consequently, the surface protective film 16 fills the spaces between the gate wiring electrode 11 and the field plate electrodes 12, between the field plate electrodes 12, and between the field plate electrode 12 and the channel stopper electrodes 13. The surface protective film 16 relieving the stress applied to the field plate electrode 12 from a sealing material for sealing the chip of the semiconductor device, thereby improving the reliability of the semiconductor device.

Embodiment 7

Figure 7:
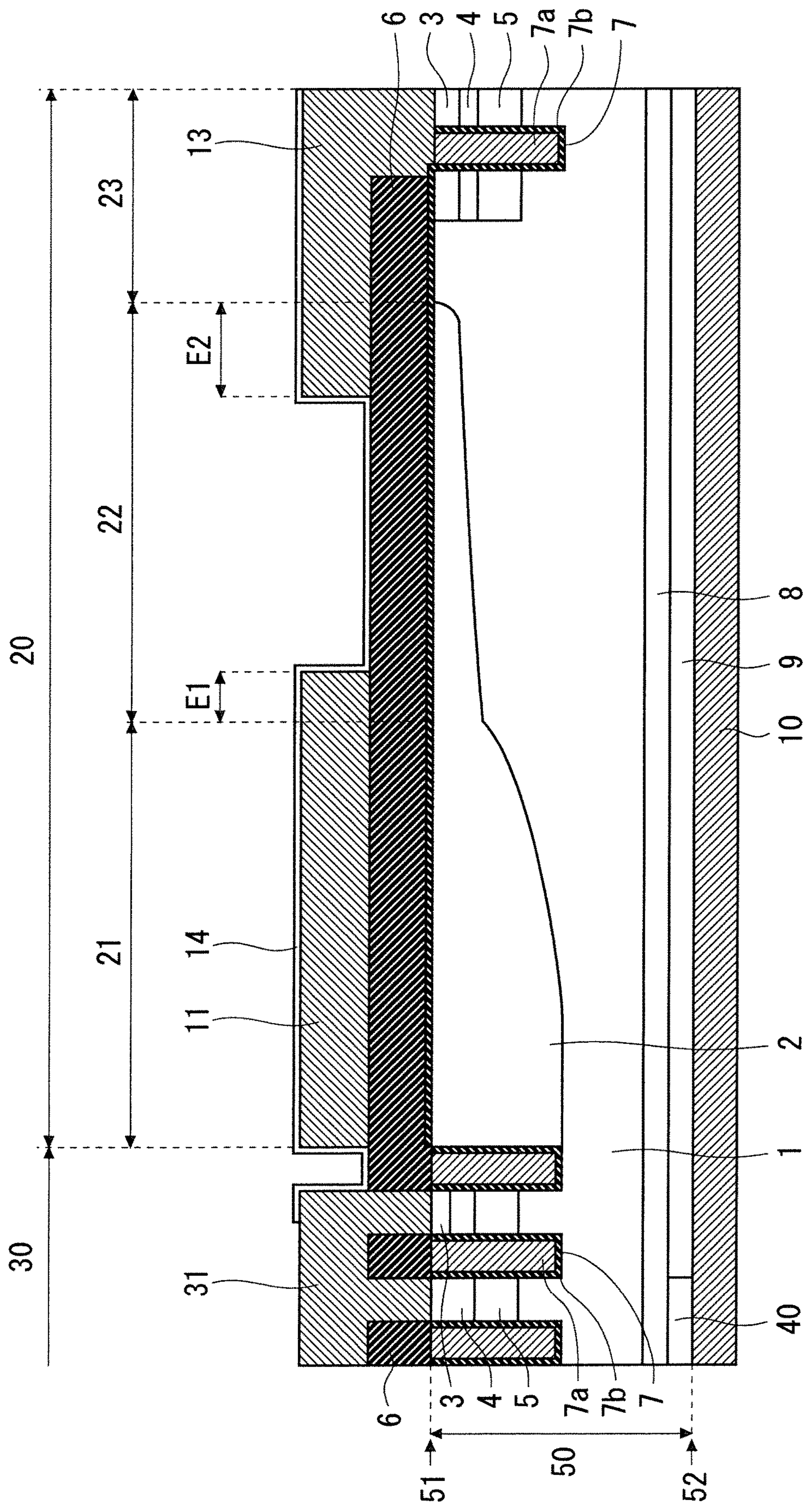
FIG. 7 is a cross-sectional view of a semiconductor device according to Embodiment 7.

FIG. 7 is a cross-sectional view of a semiconductor device according to Embodiment 7. The configuration of FIG. 7 is obtained by omitting the field plate electrodes 12 from the configuration of FIG. 1. Therefore, in present Embodiment, the semi-insulating film 14 covers the gate wiring electrode 11 and the channel stopper electrode 13 and electrically connects the gate wiring electrode 11 and the channel stopper electrode 13 together. Note that the field plate electrodes 12 may be omitted from the configuration of FIG. 5 or FIG. 6.

In the semiconductor device according to Embodiment 7, the gate wiring electrode 11 and the channel stopper electrode 13 in the termination region 20 are electrically connected through the semi-insulating film 14 which is continuously arranged without interposing the discretely arranged field plate electrodes 12. Therefore, the potential distribution between the semiconductor device gate wiring electrode 11 and the channel stopper electrode 13 becomes smooth, which contributes to the improvement of the breakdown voltage of the semiconductor device.

The Embodiments can be combined, appropriately modified or omitted.

APPENDIX

Hereinafter, various aspects of the present disclosure will be collectively described as Appendices.

Appendix 1

A semiconductor device comprising:
- a semiconductor substrate having a drift layer of a first conductivity type formed therein;
- an active region in which a semiconductor element is formed in the semiconductor substrate;
- a termination region, which is a region outside the active region in the semiconductor substrate;
- a well layer of a second conductivity type formed in the surface portion of the semiconductor substrate in the termination region, in which an impurity concentration of the second conductivity type decreases toward the outside of the semiconductor substrate; and
- a channel stopper layer of the first conductivity type formed in the surface portion of the semiconductor substrate, being more outside than the well layer is, wherein
- the termination region includes
  - an alleviating region adjacent to the active region and having the well layer formed therein,
  - a RESURF region positioned outside the alleviating region and having the well layer formed more shallowly than that in the alleviating region,
  - a channel stopper region positioned outside the RESURF region and having the channel stopper layer formed therein,
  - an electrode formed on the alleviating region through an interlayer insulating film,
  - a channel stopper electrode connected to the channel stopper layer, and
  - a semi-insulating film covering the electrode and the channel stopper electrode and electrically connecting the electrode and the channel stopper electrode.

Appendix 2

The semiconductor device according to Appendix 1, wherein
- the termination region further includes at least one field plate electrode formed on the RESURF region with the interlayer insulating film interposed therebetween, and
- the semi-insulating film covers the electrode, the at least one field plate electrode and the channel stopper electrode and electrically connects the electrode, the at least one field plate electrode, and the channel stopper to each other.

Appendix 3

The semiconductor device according to Appendix 2, wherein
- intervals of the electrode, the at least one field plate electrode, and the channel stopper electrode are even.

Appendix 4

The semiconductor device according to Appendix 2 or 3, wherein
- the at least one field plate electrodes comprises a plurality of field plate electrodes, and widths of the plurality of field plate electrodes are even.

Appendix 5

The semiconductor device according to any one of Appendices 2 to 4, wherein
- the electrode, the field plate electrodes and the channel stopper electrode are made of a same conductive material.

Appendix 6

The semiconductor device according to any one of Appendices 1 to 5, wherein
- an outer end of the electrode projects into the RE SURF region, and
- a length by which the electrode projects into the RESURF region is 0 μm or more and 30 μm or less.

Appendix 7

The semiconductor device according to any one of Appendices 1 to 6, wherein
- an inner end of the channel stopper electrode projects into the RESURF region, and
- a length by which the channel stopper electrode projects into the RESURF region is 0 μm or more and 30 μm or less.

Appendix 8

The semiconductor device according to any one of Appendices 1 to 7, wherein
- resistivity of the semi-insulating film is $1\times10^{12}$ Ω·cm or less.

Appendix 9

The semiconductor device according to any one of Appendices 1 to 8, further comprising
- an insulating layer formed on the semi-insulating layer.

Appendix 10

The semiconductor device according to any one of Appendices 1 to 9, further comprising
- a surface protection film covering the semi-insulating film so as to fill concave and convex portions present on an upper surface of the semi-insulating film.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate having a drift layer of a first conductivity type formed therein;

an active region in which a semiconductor element is formed in the semiconductor substrate;

a termination region, which is a region outside the active region in the semiconductor substrate;

a well layer of a second conductivity type formed in the surface portion of the semiconductor substrate in the termination region, in which an impurity concentration of the second conductivity type decreases toward the outside of the semiconductor substrate; and a channel stopper layer of the first conductivity type formed in the surface portion of the semiconductor substrate, being more outside than the well layer is, wherein the termination region includes an alleviating region adjacent to the active region and having the well layer formed therein, a RESURF region positioned outside the alleviating region and having the well layer formed more shallowly than that in the alleviating region, a channel stopper region positioned outside the RESURF region and having the channel stopper layer formed therein, an electrode formed on the alleviating region through an interlayer insulating film, a channel stopper electrode connected to the channel stopper layer, and a semi-insulating film covering the electrode and the channel stopper electrode and electrically connecting the electrode and the channel stopper electrode, wherein the termination region further includes at least one field plate electrode formed on the RESURF region with the interlayer insulating film interposed between the RESURF region and the at least one field plate electrode, no field plate electrode is formed on the alleviating region, and the semi-insulating film covers the electrode, the at least one field plate electrode and the channel stopper electrode and electrically connects the electrode, the at least one field plate electrode, and the channel stopper electrode to each other.

2. The semiconductor device according to claim 1, wherein intervals of the electrode, the at least one field plate electrode, and the channel stopper electrode are even.

3. The semiconductor device according to claim 1, wherein the at least one field plate electrode comprises a plurality of field plate electrodes, and widths of the plurality of field plate electrodes are even.

4. The semiconductor device according to claim 1, wherein the electrode, the at least one field plate electrode, and the channel stopper electrode are made of a same conductive material.

5. The semiconductor device according to claim 1, wherein an outer end of the electrode projects into the RESURF region, and a length by which the electrode projects into the RESURF region is 0 μm or more and 30 μm or less.

6. The semiconductor device according to claim 1, wherein an inner end of the channel stopper electrode projects into the RESURF region, and a length by which the channel stopper electrode projects into the RESURF region is 0 μm or more and 30 μm or less.

7. The semiconductor device according to claim 1, wherein resistivity of the semi-insulating film is $1\times10^{12}\Omega\cdot$cm or less.

8. The semiconductor device according to claim 1, further comprising an insulating layer formed on the semi-insulating film.

9. The semiconductor device according to claim 1, further comprising a surface protection film covering the semi-insulating film so as to fill concave and convex portions present on an upper surface of the semi-insulating film.

* * * * *